United States Patent
Day et al.

(10) Patent No.: US 7,466,734 B1
(45) Date of Patent: Dec. 16, 2008

(54) COMPACT EXTERNAL CAVITY MID-IR OPTICAL LASERS

(75) Inventors: Timothy Day, Poway, CA (US); David F. Arnone, Mountain View, CA (US)

(73) Assignee: Daylight Solutions, Inc., Poway, CA (US)

( * ) Notice: Subject to any disclaimer, the term of this patent is extended or adjusted under 35 U.S.C. 154(b) by 292 days.

(21) Appl. No.: 11/525,385

(22) Filed: Sep. 22, 2006

Related U.S. Application Data

(63) Continuation-in-part of application No. 11/154,264, filed on Jun. 15, 2005.

(51) Int. Cl.
   *H01S 3/14* (2006.01)
   *H01S 3/08* (2006.01)
(52) U.S. Cl. .......................................... 372/39; 372/92
(58) Field of Classification Search .................. 372/39, 372/40, 43.01, 49.01, 92, 98, 99
   See application file for complete search history.

(56) References Cited

U.S. PATENT DOCUMENTS

| | | | |
|---|---|---|---|
| 4,656,641 A | 4/1987 | Scifres et al. | |
| 5,082,339 A | 1/1992 | Linnebach | |
| 5,082,799 A | 1/1992 | Holmstrom et al. | |
| 5,140,599 A | 8/1992 | Trutna, Jr. et al. | |
| 5,172,390 A | 12/1992 | Mooradian | |
| 5,181,214 A | 1/1993 | Berger et al. | |
| 5,331,651 A | 7/1994 | Becker et al. | |
| 5,457,709 A | 10/1995 | Capasso et al. | |
| 5,537,432 A | 7/1996 | Mehuys et al. | |
| 5,752,100 A | 5/1998 | Schrock | |
| 6,243,404 B1 | 6/2001 | Joyce | |
| 6,326,646 B1 | 12/2001 | Baillargeon et al. | |
| 6,483,978 B1 | 11/2002 | Gao et al. | |
| 6,553,045 B2 | 4/2003 | Kaspi | |
| 6,575,641 B2 | 6/2003 | Yamabayashi et al. | |
| 6,782,162 B2 | 8/2004 | Fukuzawa et al. | |
| 6,856,717 B2 | 2/2005 | Kilian | |
| 6,859,481 B2 | 2/2005 | Zheng | |
| 7,032,431 B2 | 4/2006 | Baum et al. | |
| 7,061,022 B1 | 6/2006 | Pham et al. | |
| 2002/0090013 A1 | 7/2002 | Murry et al. | |
| 2002/0150133 A1 | 10/2002 | Aikiyo et al. | |
| 2003/0043877 A1 | 3/2003 | Kaspi | |
| 2003/0095346 A1 | 5/2003 | Nasu et al. | |
| 2003/0198274 A1 | 10/2003 | Lucchetti | |
| 2004/0013154 A1 | 1/2004 | Zheng | |
| 2004/0208602 A1 | 10/2004 | Plante | |

(Continued)

OTHER PUBLICATIONS

Hildebrandt, S.; Quantum Cascade external cavity laser systems in mid-IR SacherLasertechnik Group; Marburg, Germany.

(Continued)

*Primary Examiner*—Armando Rodriguez
(74) *Attorney, Agent, or Firm*—Roeder & Broder LLP

(57) ABSTRACT

Highly compact quantum well based laser systems with external cavity configurations are tightly integrated in a very small mounting system having high thermal and vibrational stability. The mounting systems may include adjustability and alignment features specifically designed to account for the particular nature of the micro components used. The laser systems may provide for wavelength selection, including dynamic wavelength selection. The laser systems may also provide special output couplers.

47 Claims, 6 Drawing Sheets

U.S. PATENT DOCUMENTS

| | | |
|---|---|---|
| 2004/0228371 A1 | 11/2004 | Kolodzey et al. |
| 2004/0238811 A1 | 12/2004 | Nakamura et al. |
| 2005/0213627 A1 | 9/2005 | Masselink et al. |
| 2006/0056466 A1 | 3/2006 | Belenky et al. |
| 2007/0291804 A1 | 12/2007 | Day et al. |
| 2008/0075133 A1 | 3/2008 | Day et al. |

OTHER PUBLICATIONS

Hensley, J.; "Recent updates in QCL-based Sensing Applications" Physical Sciences Inc.; Andover, Massachusetts.

Hensley, J. et al.; "Demonstration of an External Cavity THz QCL"; Optical Terahertz Science and Technology Meeting(Orlando, FL) 2005.

Hildebrandt, L. et al.; "Quantum cascade external cavity and DFB laser systems in the mid-IR spectral range: devices and applications." Marburg, Germany.

Maulini, R.; "Broadly tunable external cavity quantum cascade lasers" University of Neuchatel; Neuchatel Switzerland.

S. Blaser et al., Alpes Lasers, Room-temperature continuous-wave single-mode quantum cascade lasers, Photonics West 2006, Novel In-Plane Semiconductors V:Quantum Cascade Lasers:6133-01 Switzerland.

Gaetano Scamarcio, Mid-IR and THz Quantum Cascade Lasers, 2005, Physics Dept., University of Bari, Bari Italy.

Gaetano Scamarcio et al., Micro-probe characterization of QCLs correlation with optical performance, APL 78, 1177 & APL 78, 2095 (2001), APL 2002, APL 2004, University of Bari, Bari Italy.

Corrie David Farmer, "Fab and Eval. of QCL's", Sep. 2000, Faculty of Engineering, University of Glasgow, Glasgow, UK.

Tsekoun, A. et al; "Improved performance of QCL's through a scalable, manufacturable epitaxial-side-down mounting process"; Feb. 2006.

Gaetano Scamarcio et al., Micro-probe characterization of QCLs correlation with optical performance, APL 78, 1177 & APL 78, 2095 (2001), APL 2002, APL 2004, University of Bari, Bari Italy.

Corrie David Farmer, "Fab and Eval. of QCL's", Sep. 2000, Faculty of Engineering, University of Glasgow, Glasgow, UK.

Tsekoun, A. et al; "Improved performance of QCL's through a scalable, manufacturable epitaxial-side-down mounting process", Feb. 2006.

Pushkarsky, M. et al.; "Sub-parts-per-billion level detection of NO2 using room temp. QCLs"; May 2006.

Wirtz, D. et al.; "A tuneable heterodyne infrared spectrometer", Physikalisches Institut; University of Koln; Koln Germany Spectrochimica 2002.

Williams, B. et al.; "Terahertz QCLs and Electronics"; PhD-MIT 2003.

COMPACT EXTERNAL CAVITY MID-IR OPTICAL LASERS

RELATED APPLICATIONS

This application is a continuation in part of copending U.S. application Ser. No. 11/154,264 filed Jun. 15, 2005, the entirety of which is incorporated by reference.

BACKGROUND

1. Field

The following disclosure is generally concerned with mid-IR laser systems based upon quantum well semiconductors, and specifically concerned with short external cavity, highly compact quantum well lasers.

2. Related Technology

Unipolar Quantum well lasers, sometimes referred to by a name coined by early pioneers "quantum cascade lasers" or QCLs, were first suggested in the 70s and finally reduced to practice in a laboratory late in the 80s. These lasers enjoy remarkably unique properties quite unlike other semiconductor laser systems. Quite unlike their predecessor cousins the diode laser, these lasers are formed from a single semiconductor type (either N-type or P-type) and do not include lasing at a band gap of a semiconductor junction. These devices which lase in the valuable mid-IR spectrum can be fashioned to support extremely wide gain bandwidths, they are suitable for high-power output, they are very small, inexpensive, efficient and durable. Despite these, quantum well lasers have not yet made an appreciable commercial impact. Their use remains almost exclusively restricted to professional research laboratories having highly specialized supporting equipment. Some versions of the systems require complex cooling apparatus, sophisticated electronic drive and detection means and other specialized optical support. Recently, quantum well gain systems have been arranged in conjunction with optical resonators which include a free space portion. Sometimes called in the art "external cavity QCLs" or "ECQCLs", these arrangements permit valuable access to the resonator cavity which was not otherwise available in devices with gain medium having integrated end mirrors. By way of the cavity access, advanced wavelength tuning schemes are just being suggested at the time of this writing.

QCLs have been described in extensive patent publications from an early day as pioneers recognized their immense future value. In particular, Bell Laboratories now Lucent Technologies, produced at least the following patents related to early quantum cascade laser systems. These include U.S. Pat. Nos. 5,311,009; 5,457,709; 5,502,787; 5,509,025; 5,570,386; 5,727,010; 5,745,516; 5,901,168; 5,936,989; 5,978,397; 6,023,482; 6,055,254; 6,055,257; 6,091,753; 6,134,257; 6,137,817; 6,144,681; and 6,148,012. Of course, many others also have since made interesting inventions around the QCL foundation.

Of particular importance for this disclosure is quantum well lasers configured in external cavity configurations.

Recently, new patent publications have just started to suggest these combinations. In particular, US Patent Application Publication 2003/0043877, titled "multiple wavelength broad bandwidth optically pumped semiconductor laser" teaches quantum well based system having tunability taken up outside the gain medium. Inventor Kaspi further suggests an optically pumped version of this systems which requires special optical coupling between a pump source and the gain medium device—i.e. addition ex-cavity cooperation.

Another important patent related publication is teaching by Masselink et al published Sep. 29, 2005 as patent application publication numbered US 2005/0213627. This invention includes a quantum cascade laser structure coupled to an external cavity to effect wavelength tuning. Masselink et al systems are particularly distinguished in that they employ a mechanical stress or strain on the device crystal to impart a preferred output.

Non-patent publications have also now started to suggest interesting arrangements of QCLs in combination with wavelength tuning performed in free space or externally with respect to the gain medium.

A description of a tunable ECQCL is presented as "Broadly tunable external cavity quantum-cascade lasers" by Maulini, R. et al. from the Institute of Physics, University of Neuchatel, Switzerland. Broadly tunable (300 cm$^{-1}$) TEC cooled external cavity systems have been demonstrated. So called bound to continuum device designs support very wide gain bandwidth in these very useful systems.

Hildebrandt et al also teach of external cavity wavelength tuned QCLS. Hildebrandt points out that a QCL gain medium must be coupled to an external cavity via carefully prepared anti-reflection coatings at one device emission facet. Hildebrandt arranged his systems in a Littrow configuration to achieve selected wavelength feedback via a grating element. In another disclosure, one titled: "Quantum cascade external cavity laser systems in the mid-infrared spectral range" Hildebrandt et al similarly describe QCL gain systems coupled with external cavities. They indicate compact devices can be made via use of ZnSe collimation lenses in Littrow feedback arrangements.

Hensley, et al demonstrate on behalf of Physical Sciences, Inc. long wave (THz) QCLs in an external cavity. In a professional laboratory environment, a cryostatically cooled system is coupled on an optical bench to a movable grating via an off-axis parabolic collimation optic.

Liquid helium and significant supporting apparatus are required to realize the device. The total cavity volume is greater than 100's of cubic centimeters. The same Hensley also publishes a "QCL breath analysis system" shown on an optical bench in a collection of high precision mounting and alignment optics maintained on a rigid optical bench. Again, this system suitable for laboratory use may be characterize as another very large cavity system.

While systems and inventions of the art are designed to achieve particular goals and objectives, some of those being no less than remarkable, the art has limitations which prevent laser use in new ways now possible. Inventions of the art are not used and cannot be used to realize the advantages and objectives of the inventions taught herefollowing.

SUMMARY

A compact, external cavity mid-IR optical laser system may utilize unipolar quantum well semiconductors in conjunction with unique structural arrangements of component parts which operate together as a unipolar quantum well external cavity laser. An external cavity including a free space portion permits cavity access whereby wavelength tuning may be effected. Both static and dynamic wavelength tuning systems may be arranged in conjunction with these lasers.

A particular distinction of these devices relates to their overall size. The cavities presented here are arranged in configurations permitting an overall cavity length less than 30 millimeters. Collimating optics and wavelength select elements are very tightly integrated and placed in close proximity with one another. As such, a high-performance laser package of very small size is made durable and rugged and is suitable for use as a stand-alone commercial product.

A special base preferably supports integration of semiconductor gain medium, collimation lens holder, and a wavelength select element to form a short external cavity. In preferred versions, a cavity may be made as small as 8 millimeters. This includes a first cavity mirror, a gain medium coupled to a free space portion, a diverging beam incident on a collimation lens, a collimated beam portion, and a wavelength select element. Further, the base may additionally accommodate a specialized output coupler lens, an electronic drive assembly, and active cooling systems. The component parts are fashioned to cooperate with each other in a very small volume of just a few cubic centimeters. These parts are specifically designed to perform well together in view of both thermal and vibrational considerations. In addition, the mounting system provides accurate alignment mechanisms suitable for very close proximity, precise positioning. In this way, durable, miniature mid-IR lasers based upon quantum well semiconductors may be provided with physical characteristics and structural properties that make them suitable for wide scale commercial use.

A special intra-cavity collimating lens may be used to couple light emitted by the gain medium to the wavelength select element. These lenses are mid-IR, high numerical aperture, short focal length aspheric singlets of plano-convex configuration. The lenses provide special cooperation between short cavities and integrated mounting systems and gain media having highly divergent output, enabling systems that are highly compact,

BRIEF DESCRIPTION OF THE DRAWING FIGURES

These and other features, aspects, and advantages will become better understood with regard to the following description, appended claims and drawings where:

FIG. 1 is an exploded perspective view of one preferred version of these devices;

A basic cross sectional block diagram a laser and associated nomenclature is presented as FIG. 2;

DETAILED DESCRIPTION

Figure 1:
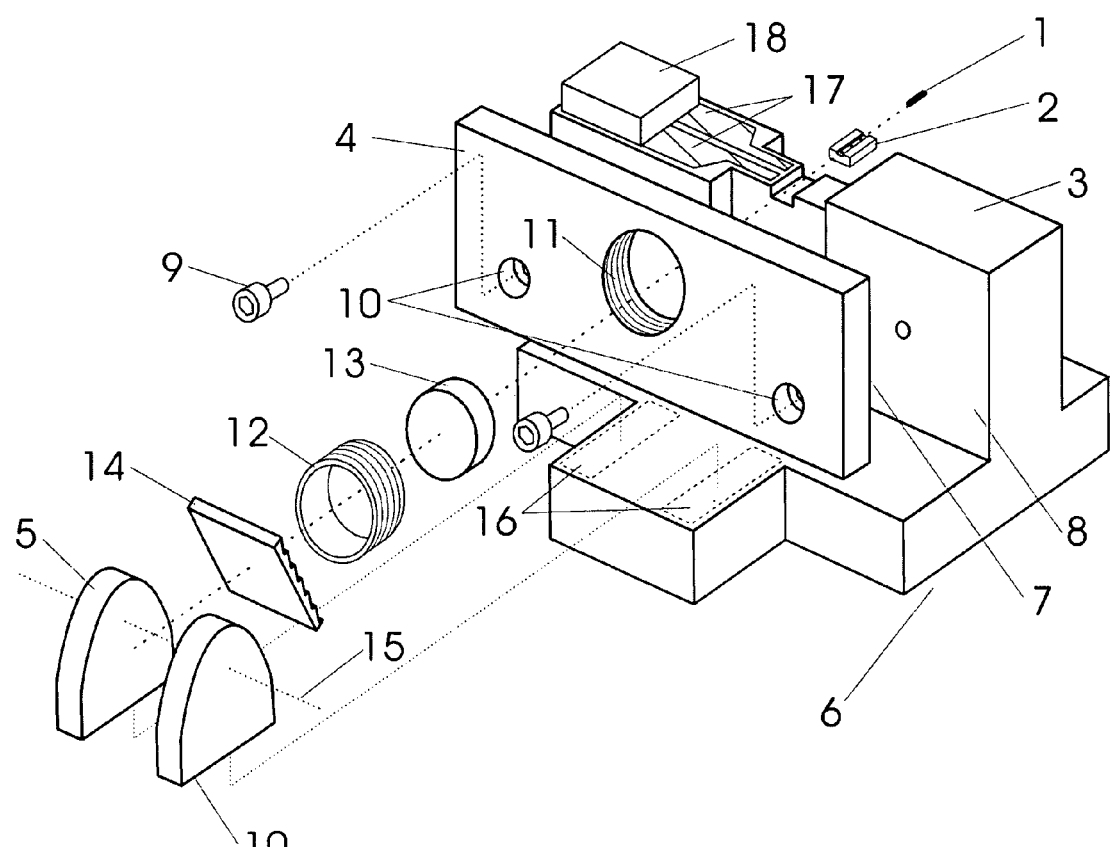

Throughout this disclosure, reference is made to some terms which may or may not be exactly defined in popular dictionaries as they are defined here. To provide a more precise disclosure, the following terms are presented with a view to clarity so that the true breadth and scope may be more readily appreciated. Although every attempt is made to be precise and thorough, it is a necessary condition that not all meanings associated with each term can be completely set forth. Accordingly, each term is intended to also include its common meaning which may be derived from general usage within the pertinent arts or by dictionary meaning. Where the presented definition is in conflict with a dictionary or arts definition, one must consider context of use and provide liberal discretion to arrive at an intended meaning. One will be well advised to error on the side of attaching broader meanings to terms used in order to fully appreciate the entire depth of the teaching and to understand all intended variations.

Quantum Well Stack. A quantum well stack is a semiconductor structure having a plurality of thin layers of highly regulated thickness. These thin layers define quantum well and barrier systems which support particular electron energy states and energy state transitions in accordance with a particular design. By careful selection of these energy state transitions, a quantum well stack may be fashioned and operate as the core of a laser gain medium. When a quantum well stack semiconductor is combined with a suitable optical resonator system and energizing or 'pumping' system, a device which supports stimulated emission or lasing action is achieved. For this paragraph, 'thin' means on the order of the de Broglie wavelength of an associated electron.

Unipolar Quantum Well Gain Medium. A unipolar quantum well gain medium is a system of elements including pump mechanism, waveguide system, unipolar quantum well stack, emission facets, and a base substrate, which operate together to provide optical amplification by stimulated emission. For purposes of this disclosure, a unipolar quantum well gain medium is distinct from a laser in that it does not include an optical resonator. Gain media described herein are always unipolar. That is, gain media are comprised of semiconductor materials of a declared semiconductor type either 'P' or 'N'. Thus, unipolar devices are certainly distinct from diodes which include both N-type and P-type and particularly a junction between. Conversely, unipolar systems are comprised of exclusively one semiconductor type.

High Numerical Aperture. High numerical aperture is herein defined to mean numerical apertures greater than about 0.7. While common optical systems typically include those having a numerical aperture less than 0.5; optical systems having a numerical aperture of 0.7 or greater are exceptional and considered as having a "high numerical aperture". While a numerical aperture of 1 has theoretical meaning, it remains quite difficult to realize in practical systems a numerical aperture greater than about 0.95. Thus, 'high numerical aperture' is best considered as those systems having a numerical aperture with any value between about 0.7 and 0.95.

Short Focal Length. Short focal length refers to lenses and focusing mirrors which have a focal length less than about 8 millimeters. As there is no certain meaning associated with a lens having f=0, we declare a lower limit on our 'short focal length' to be about 0.5 millimeters. Any value between about 0.5 and 8 millimeters is herein considered a short focal length.

In accordance with preferred embodiments, highly compact, high performance tunable mid-IR laser systems are provided. In particular, quantum well based semiconductor lasers arranged with external resonator cavities. It will be appreciated that each of the embodiments described include an apparatus and that the apparatus of one preferred embodiment may be different than the apparatus of another embodiment.

While practitioners of the art have devised remarkable quantum cascade lasers in external cavity configurations, those systems are exclusively arranged with component parts which are quite large and bulky—indeed hundreds of times larger than the miniature systems which are first presented in this disclosure. Lasers of these embodiments are highly compact systems of very tightly integrated component parts. Further, these laser systems include certain optical components of a nature heretofore never attempted. System mechanical designs account for two major objectives including: provision of excellent thermal coupling between all component parts to reduce misalignment due to thermal expansion, and provision of extremely short distances between component parts to enhance vibrational resistance. Further, it is a feature of great importance that these systems so arranged in tightly integrated packages are highly mobile, ruggedized light source assemblies.

An important physical structure which contributes to these new designs is an optical resonator fashioned to support a cavity length no more than about 30 millimeters. In best versions a cavity length can be made between about 8-12 millimeters. A cavity is necessarily greater than 5 millimeters to contain all required component parts. Accordingly, cavities of these embodiments are particularly distinct as including those having a length of any value between 5 and 30 millimeters. Special new optical elements from which a resonant cavity is comprised have been created to cooperate with these very short cavity lengths. Namely, a highly unique lens suitable for use in the mid-IR spectrum is a near diffraction limited, aspherical plano-convex singlet of numerical aperture greater than about 0.7. The lens cooperates particularly well with and is suited to the characteristic high divergent output of a quantum well gain medium. Such a lens is used as an in-cavity collimation lens to couple output from a gain medium to a cavity feedback element.

Because the lens is used as an intracavity element, various aspects of its performance greatly influence the efficiency of these lenses. For example, lenses considered 'acceptable' by others suffer from diffraction complexities. That is, lenses having numerical aperture less than 0.7 tend to introduce and couple light of high spatial frequency back to the gain medium and result in very 'noisy' outputs. Further, spherical lenses used by others cannot achieve diffraction limited spot sizes and tend to be very lossy as well as tending to excite higher order or transverse cavity modes. Thus spherical lenses used intracavity severely diminish laser performance. Finally, lenses having very short focal lengths of 8 millimeters or less permit small cavity configurations and stable mounting systems not achievable in systems built upon conventional optics.

In addition, a second similar lens may be used to condition a laser output beam. When used as an output coupler, the lens produces distinct output beams of very high quality not found in any existing semiconductor devices today.

In general, laser systems produce optical output in a light beam which can be quantified in various important ways to reflect the quality of the system. One important aspect of a laser beam is its intensity. For a prescribed gain medium, laser resonators might be arranged in various ways to produce preferred outputs. If the beam diameter of a collimated laser beam is reduced, the beam's intensity is increased. Thus it is sometimes desirable to arrange a laser device to have as narrow of a beam as possible to achieve the maximum output intensity. Laser system arrangements presented here employ two important new configurations to increase the intensity of quantum well based mid-IR laser outputs. A first includes a special output coupler lens. A lens with a very high numerical aperture and short focal length yields a collimated output beam on the order of about 4 millimeters. As such, the beam intensity is greatly improved when compared to common systems using 1 inch collimation optics standard in the art.

In addition, the systems are specially arranged to improve the on-axis intensity of an output beam. By careful design and configuration of a gain medium active region or 'stripe', off-axial or transverse oscillation modes are suppressed. Lasers operating solely in longitudinal modes have higher on-axis intensity. This is particularly important in systems having optical elements susceptible to aperture clipping of high spatial frequency components. When a quantum well gain medium is arranged as a narrow stripe of about 25 or less micrometers, transverse modes are lost to absorption at an opaque or otherwise absorbing material on the gain medium side extremities.

Accordingly these systems include quantum well based mid-IR lasers having very high beam intensities, and in particular on-axis intensity. Output beams characterized as having a beam waist diameter of 4 millimeters (at $1/e^2$ points) and comprising only longitudinal modes, are of exceptionally high quality and usefulness and cannot be realized without the optical arrangements taught herein.

Another major feature of some preferred versions relates to wavelength tuning. Because a quantum well gain medium can be configured to support a very wide gain bandwidth, these devices are ideal for wideband wavelength tuning. Very small wavelength select elements are used in place of or in conjunction with a cavity mirror to force cavity resonance on a single narrow wavelength band. Wavelength select elements used in these devices are distinct because their clear apertures are very small; sometimes on the order of 25-50 square millimeters. In some versions where a wavelength select element is tuned by rotation about an axis, their small size and more specifically light mass, makes them easy to drive at high speed with micro-electromechanical actuators with moderate power consumption.

These systems are further particularly characterized by their advanced monolithic mounting systems. An integrated system of cooperating elements provides positioning, alignment, and mounting function for the various compact optical elements from which these optical sources are comprised. In preferred versions, the mounting system can be machined from metal having high thermal conductivity. In best versions, the entire mass of the mounting system is very small and of the order of the few hundred grams and occupies a volume less than about 10 cubic centimeters. However some versions may be implemented in very small mounting systems of just 1 cubic centimeter; while other systems remain useful and enjoy the functionality brought by these teachings and still be as large as 30 cubic centimeters. Thus, these mounting systems include all those having a volume with any value between about 1 and 30 cubic centimeters.

One preferred embodiment is expressed in FIG. 1. A gain medium semiconductor device 1, cooperates with chip carrier or sub mount 2, to form a highly conductive thermal coupling therebetween. In some preferred versions, a chip carrier is fashioned from diamond which has a very high thermal conductivity and quickly spreads heat generated at the gain medium and further passes that heat into the bulk material of the primary base element or 'sled' 3. A diamond chip carrier is also coupled to a receiving seat in the sled to form a bond which is highly conductive with respect to heat. This sled base element is preferably fashioned from a forged block of metal and sometimes a metal like copper or copper alloy having good thermal conduction properties. As such, the sled has high thermal momentum as well as high thermal conductivity which further enhances thermal stability of these systems. The sled is further coupled to other system components in a manner which operates to keep the entire system at the same relative temperature. Since alignment stability is improved when all parts of the system are maintained at the same temperature, it is useful to provide good thermal coupling between the sled and the lens plate 4, and further a feedback element holder 5. When the system operates at various temperatures, all parts expand and contract in conjunction with each other as one piece to preserve alignment.

The sled additionally provides means for disposing heat generated at the gain medium. The bottom surface 6 of the sled is configured for thermal coupling with a heat sink. Any heat generated quickly passes through the sled bulk material and exits to the bottom surface where heat may be further carried away. In some advanced versions, a heatsink is prepared as an active system, a thermoelectric cooler TEC, and those systems may be directly coupled to the bottom surfaces of these sleds. Accordingly, use of advanced heatsink facility is fully anticipated for demanding high performance applications. However, in some systems the bottom surface of the base may operate to dissipate heat merely by radiative emission and an active heat sink is not necessary.

The lens plate is prepared with a lapped planar surface 7 which cooperates with a similar lapped planar surface 8 to form a sliding planar interface. This sliding interface permits positional adjustments of the lens plate in two orthogonal directions, i.e. those in the plane surface. Set screws 9 mate with oversized holes 10. When a desired relative position between the lens plate and the sled is achieved, set screws may be applied to disable further movement at the sliding interface and hold fast the lens plate to the sled. It is easy to appreciate in this adjustment/lockout scheme, good thermal coupling is maintained by way of contact over the large surface area. The lens plate also includes a threaded hole 11, having a thread axis perpendicular to the lens plate surface. These threads are preferably quite fine in pitch to permit more precise adjustability. The threaded hole is arranged to cooperate with mating threads on the outside surface of a cylindrical lens holder element 12. The lens holder element includes a lens receiving cavity and seat into which a lens 13 may be inserted and securely seated and affixed. Thereafter, the lens/lens holder may be inserted together into the threaded hole. Position adjustments along an optical axis are effected by advancing or retracting the thread coupling between the lens holder and the lens plate. In this way, it is easy to accurately place the lens surface quite precisely near an emission facet of the quantum well gain medium. Indeed, this system is effective for placing the lens surface about 600 microns from the emission surface with fine adjustment which easily supports increase or decrease in increments of about 1 micron. Again, one will appreciate that the very intimate mounting arrangement of the lens guarantees good thermal exchange and the lens, lens holder, and lens plate all stay at the same temperature as the sled as they are very tightly integrated and thermally coupled thereto in a unique fashion. Temperature variations between parts are essentially eliminated.

Feedback element 14 is preferably coupled with the feedback element holder on a pivot axis 15 whereby the device remains rotatably affixed. While the pivot axis is sometimes arranged as shown intersecting the system axis, it is also possible in some versions to arrange a pivot axis which does not intersect the optic axis nor even intersect the feedback element itself. The precise location and nature of the pivot axis is configured differently in various versions. Adjustments to the feedback element are freely made while the holder remains secure and held fast at its large area mounting pads 16 on the sled. The large area assures good thermal transfer between the holder and the sled. Thus, the feedback element holder is also strongly coupled to the sled with respect to thermal considerations assuring further that all components remain at constant or otherwise stable temperature. Finally, electrical leads 17 and electronics sub-assembly 18 used to energize the gain media may additionally be coupled to a sled surface.

FIG. 1 illustrates a preferred embodiment. However as it includes a great amount of detail, it might seem to suggest a narrow definition for some component parts. This is not intended and the reader is reminded that the true scope of these systems and individual components can only be appreciated by the entire teaching rather than by a single specific embodiment.

These embodiments are further distinct from the art in many ways. Primary important features of these embodiments not found in the art relate to improvements in stability, ruggedness, mobility and miniaturization. Further, improved beam output quality is also achieved. These improvements are realized because highly specialized components are used in unique arrangements to form new optical sources. In particular a very short external resonator is combined with a unipolar quantum well gain medium. The art is replete with quantum cascade lasers having short cavities (about 1-3 millimeters), however these cavities are always directly integrated with the gain medium. That is, the cavity mirrors are formed on the gain medium emission facets. These arrangements severely restrict access to the cavity and foreclose on many useful possibilities. The art additionally includes many external cavity QCLs systems. However these all have been arranged with large precision multi-purpose optical elements, separated by great distances, in highly controlled and regulated laboratories. Except for the expensive precision instruments which provide for accurate alignment, and highly controlled temperature regulation facilities such as cryonics systems, and the vibration and mechanical stability provided by huge optical tables, these systems are susceptible to failure and were otherwise impossible to realize. Only by means of the teachings here can compact mid-IR external cavity sources be realized. These exceptional arrangements do not require large precision instruments, cumbersome cooling apparatus, nor stable optical benches.

Figure 2:
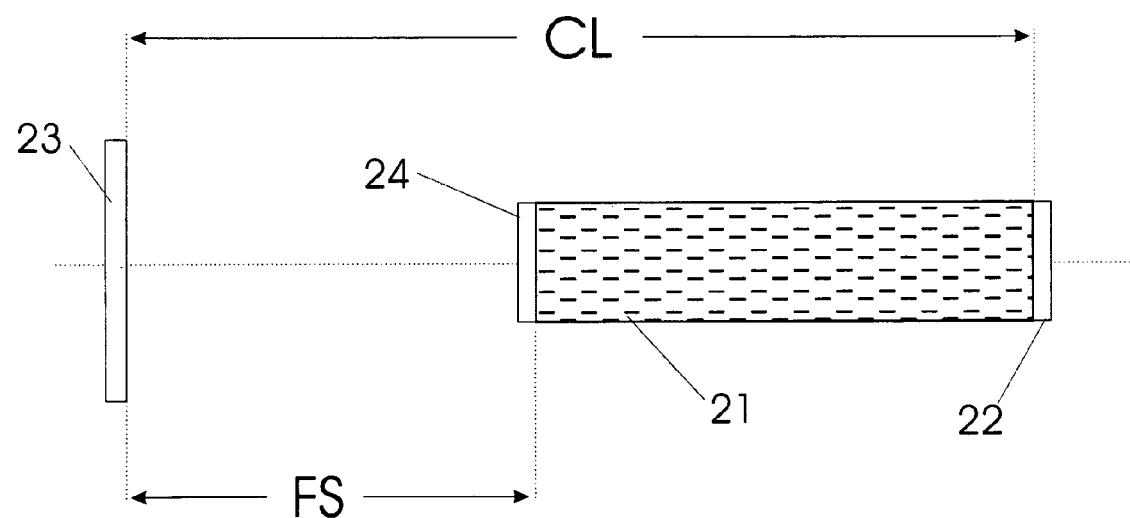

A first unique structural feature readily appreciated in these systems is the very short cavity length CL. Cavities of these embodiments are arranged to be no more than about 30 millimeters. In some exceptional versions, a cavity is made between 8-12 millimeters in length. While still including a free space portion, the total cavity volume may be many thousands of times smaller than external cavities of QCLs in the published arts. With reference to FIG. 2, one will appreciate that a quantum well gain medium 21 having a first feedback element, an end mirror 22 integrated therewith and a second feedback element 23 forms a optical resonant cavity of length CL having free space portion FS. Accordingly, by "external cavity" it is herein meant that the cavity includes at least one free space portion. That is, at least some portion of the resonant cavity is external with respect to the gain medium. Optical element 24 may be an anti-reflection system which permits good coupling of optical beams into and out of the gain medium device.

The diagram of FIG. 2 supports several important variations each of which is considered a viable subset of these embodiments. A resonant cavity can be formed where both feedback elements 22 and 23 are arranged as mirrors. Because a beam leaving the gain medium is highly divergent, feedback element 23 may be arranged as a mirror having a curved surface. A high reflector HR mirror with a radius of curvature which approximates the wavefronts will return an incident beam back to the gain medium for further amplification while at the same time permitting a small portion of the light to pass as laser output. While the mirror is shown in the diagram as a simple block, it can be easily appreciated that such end mirrors for lasers may have a high degree of curvature; the drawing is not intended to be an engineering drawing. A first surface spherical mirror such as gold on germanium is sufficient for this application. This configuration is particularly interesting because the reflectivity of the mirror can be finely tuned to a precise value which cooperates with any particular resonator demanding a feedback of certain strength. The second mirror 22 of the cavity may be arranged as a multi-layer thin film deposit on a crystal cleaved facet to form a complete resonator cavity.

One first alternative includes a special wavelength selection means which discriminates against wavelengths not in a prescribed wavelength band. Anti-reflection coating 24 may be arranged as a thin-film wavelength filter which passes light only of prescribed wavelength. By careful selection of the thin-film filter layers, one effectively tunes the laser to oscillate in a particular wavelength band. This is one example of a static wavelength tuned system. Thus, the performance of the cavity can be manipulated by various of the optical components from which it is formed.

It is similarly possible to prepare feedback element 22 as a notch filter mirror to similarly cause the system to lase only on a prescribed wavelength band. This is a first example of how an end mirror may be combined with a wavelength select function as a single element.

In all of these suggested alternatives, a short cavity of 30 millimeters or less including a free space portion is formed in conjunction with a quantum well gain medium to produce highly compact lasers. While systems described in conjunction with FIG. 2 are believed to be most useful, there are other systems with even higher performance and those are illustrated hereafollowing in connection with FIG. 3.

In some advanced versions of these preferred embodiments, a wavelength select element of high precision is deployed. For example, a grating element, or specifically a blazed grating element may be arranged to select a very narrow wavelength band for feedback to the amplification stage or gain medium. In this way, very precise wavelength tuning is enabled. While a grating is very useful, a prism or other dispersion element may be used in its stead.

In most cases, use of such a dispersion element for fine wavelength selection demands an incident beam having planar wavefronts; i.e. a collimated input. Accordingly, versions of these external cavity quantum well gain medium lasers include one additional optical component as an integral part of the cavity. A collimation lens is provided between the gain medium and high-performance wavelength select element. The lens converts a highly divergent light beam from the gain medium to collimated light suitable for interaction with a blazed grating for example.

Figure 3:
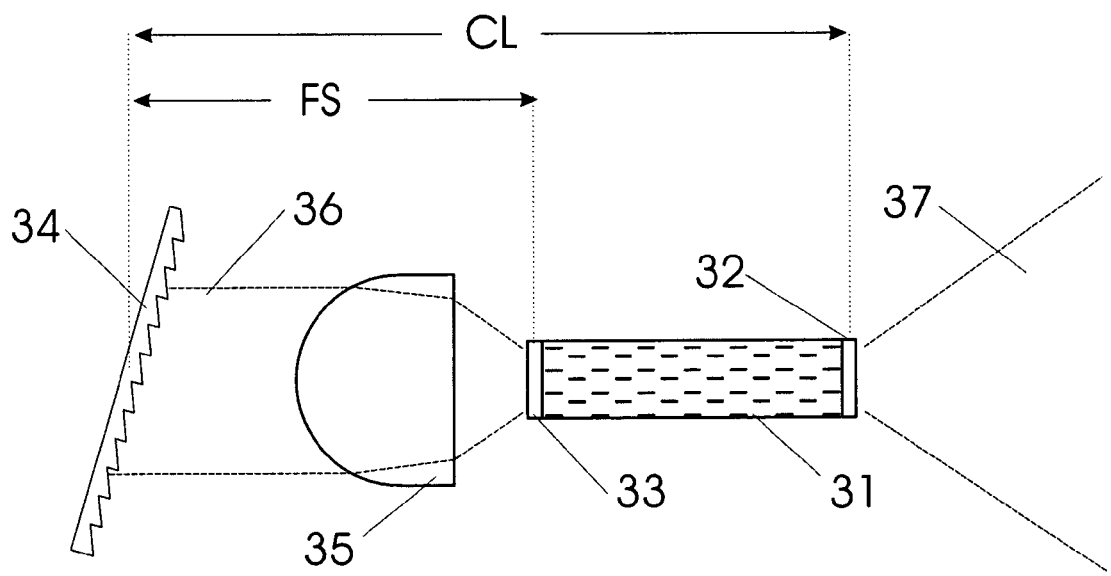
FIG. 3 illustrates in a similar diagram showing a laser with a static wavelength tuning element.

FIG. 3 illustrates a quantum well gain medium 31 having a feedback element 32 an antireflection coating 33 and second feedback element 34, a wavelength select element of specialized nature. In addition, these cavities also include a high-performance lens 35. A near diffraction limited aspherical mid-IR lens of numerical aperture greater than about 0.7 and focal length less than about 8 millimeters is preferably arranged as a plano-convex thick lens. When properly coupled with the emission facets of the quantum well gain medium, the lens forms a collimated beam 36 having a beam waist less than 5 millimeters. Beams with small cross-sections permit use of a second feedback element having a correspondingly small clear aperture. This is a great benefit for stability and system compactness.

Other important features of these feedback elements include their wavelength selection ability. Because the beam is collimated by the lens, a grating can be used to cause a single narrow wavelength band to be fed back to the gain medium for amplification. Thus, the resonator has an output beam 37 of very narrow linewidth. While a grating is a preferred type of wavelength select element, similar arrangements of alternative wavelength select elements are possible. In laser systems it is possible to achieve wavelength selection or wavelength tuning by way of a wavelength select element from the group including: an acousto-optic light modulator; electro-optic light modulator; a grid; a thin-film filter; a prism; a grating; a holographic optical element; kinoform; binary optical element; a Fabry-Perot system arranged as a wavelength filter; and a Fresnel surface relief optical element. Sometimes, the wavelength is selected by rotating a dispersion element about a rotation axis. In other systems, it is not necessary to apply a mechanical displacement to effect a wavelength change. For example, an acousto-optic device may diffract light in response to a change in an applied driving signal. Similarly, an electrooptical system may be used to couple light of a specific wavelength to a gain medium in response to an applied electronic signal. A Fabry-Perot wavelength filter may be driven by an applied heating system to tune the pass frequency in another wavelength selection scheme. In yet another, a micro electromechanical system, or MEMS, might be coupled to cooperating devices to form a wavelength selection system. Either of these or another may have particular advantage connected therewith and it is noted that compound laser systems benefiting from such advantage while also achieving the other structures first presented here are fully anticipated.

It is to be further appreciated that many various alternative arrangements of these devices are possible; any of which may be combined with the arrangements presented herein to gain the advantages suggested. Thus, slight deviations as to cavity configuration should not be considered outside the scope of these embodiments. The following illustration suggests some alternative cavity configurations considered equally part of these teachings.

Cavities illustrated in FIG. 3 are sometimes referred to as a 'Littrow' configuration. More particularly, a double-ended Littrow. It is 'double-ended' because both ends of the gain medium are used—one as an output and the other in conjunction with a wavelength tuning system. It is possible in Littrow systems to take an output beam off the grating (i.e. the zero order or reflected beam) in a single-end Littrow arrangement. Both single-end and double-end Littrow configurations are considered viable cavity arrangements which cooperate with these embodiments and both fit equally well within the scope thereof.

Figure 4:
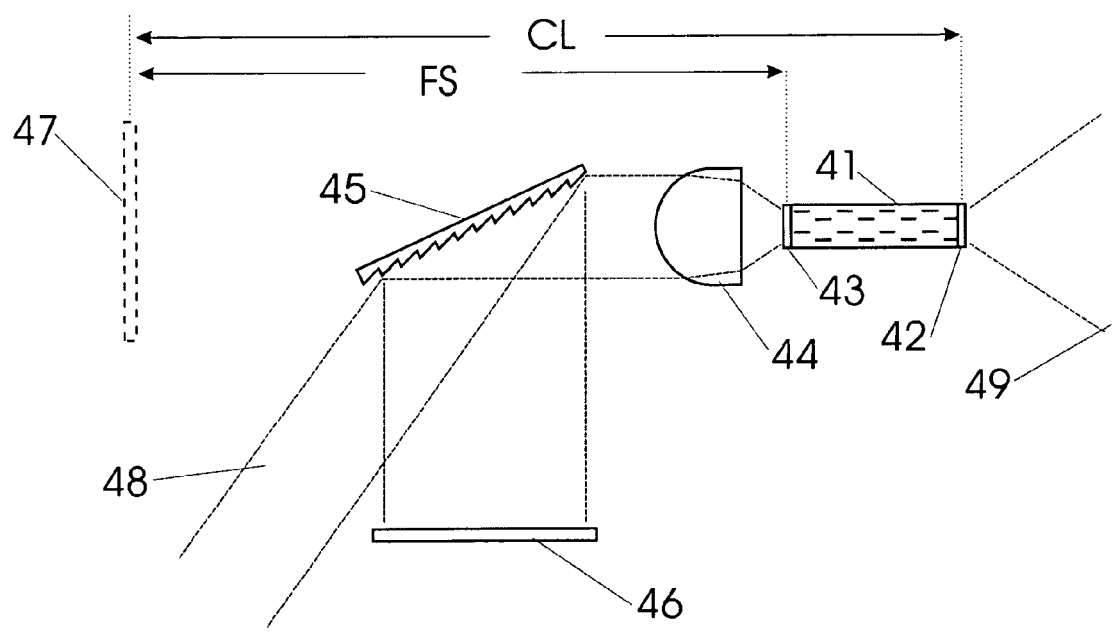
FIG. 4 depicts an alternative version of a resonator including a two part wavelength selection system.

Important alternative cavity configurations additionally include those having a two-part wavelength select element. A 'Littman' or sometimes Littman/Metcalf arrangement includes wavelength selection means taken up via a combination of a dispersion element and spatially displaced mirror. FIG. 4 shows one possible arrangement of the Littman/Metcalf cavity which may be used as a resonator cavity in these systems.

A double ended Littman/Metcalf is realized when a gain medium 41 is prepared with an output emission facet 42 and an anti-reflection facet 43. Collimation lens 44 couples a beam to grating 45 which is arranged in a grazing incidence orientation. A diffracted beam is incident on mirror 46 and returned to the grating where a second diffraction occurs and a beam of very narrow linewidth is returned as feedback to the gain medium. For geometric convenience, the mirror is represented in phantom 47 to 'unfold' the cavity and provide consistency with respect to the free space FS and cavity length CL indicators.

It is further possible to provide these Littman/Metcalf cavities in single end versions. If end mirror 42 is arranged as a high reflector without output, then a laser output beam may be taken from the zero-order or glancing reflection 48 of the grating. Accordingly, both Littrow and Littman/Metcalf are various versions thereof are all considered useful resonator cavity arrangements in view of these embodiments. One does not traverse the claims merely be selecting some cavity system not explicitly set forth and presented in detail here. It is recognized that many possible resonators not mentioned will gain great benefit from the new configurations defined in the appended claims.

Since these optical sources are designed for use in conjunction with other systems and optical set-up and experiment, it is quite convenient that they provide a final output of preferred conditioned nature. Commercially available quantum cascade lasers have all been provided with a highly divergent output and it was left to the end-user scientist to provide coupling optics suitable for his particular system. Those provided optics might be sufficient for collimating a beam of those devices, however the optic provided necessarily has no mechanical relationship with the laser cavity and component mounting systems.

In contrast, most preferred versions of these systems are arranged with pre-conditioned output beams. In particular, highly collimated beams of very small cross-section are provided by way of an integrated output coupler. A very special micro-lens is tightly coupled to the laser and more particularly to the sled. The micro-lens is carefully positioned to collimate the laser emission and provide this narrow beam as system output.

Figure 5:
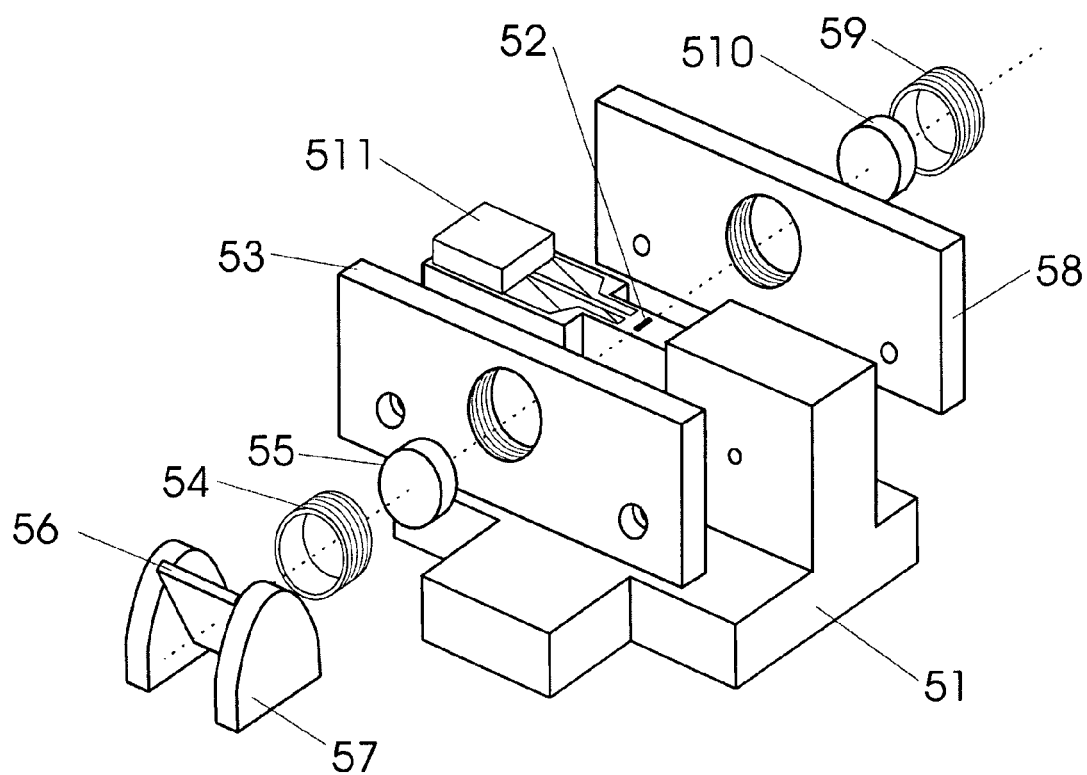
FIG. 5 is another exploded perspective of a system having an added output coupler portion.

FIG. 5 illustrates. Sled base element 51, directly receives quantum well gain medium semiconductor 52 thereon at a provided mounting seat fashioned to align and thermally connect the semiconductor to the base. Cavity side lens plate 53 couples lens holder 54 to hold lens 55. Wavelength select type feedback element 56 is held in feedback element holder 57 to complete the wavelength tuned resonator cavity. Output coupler side lens plate 58 couples with lens holder 59 to receive therein and hold output coupler lens 510. The output coupler lens is positioned and aligned to receive laser output from an emission surface of the gain medium and to collimate that output into a very narrow beam of planar wavefronts. The output coupler lens, quite similar or identical in size and specification as the cavity lens, is preferably a mid-IR, aspherical singlet having focal length less than 8 millimeters and numerical aperture between about 0.7 and 0.95.

Finally, electronic subassembly 511 is disposed near the semiconductor to provide drive current as necessary. Since the output coupler lens is also integrated with the system package, it remains temperature and alignment stable without requiring sophisticated laboratory type systems to provide advance coupling, re-alignment, and conditioning.

Figure 6:
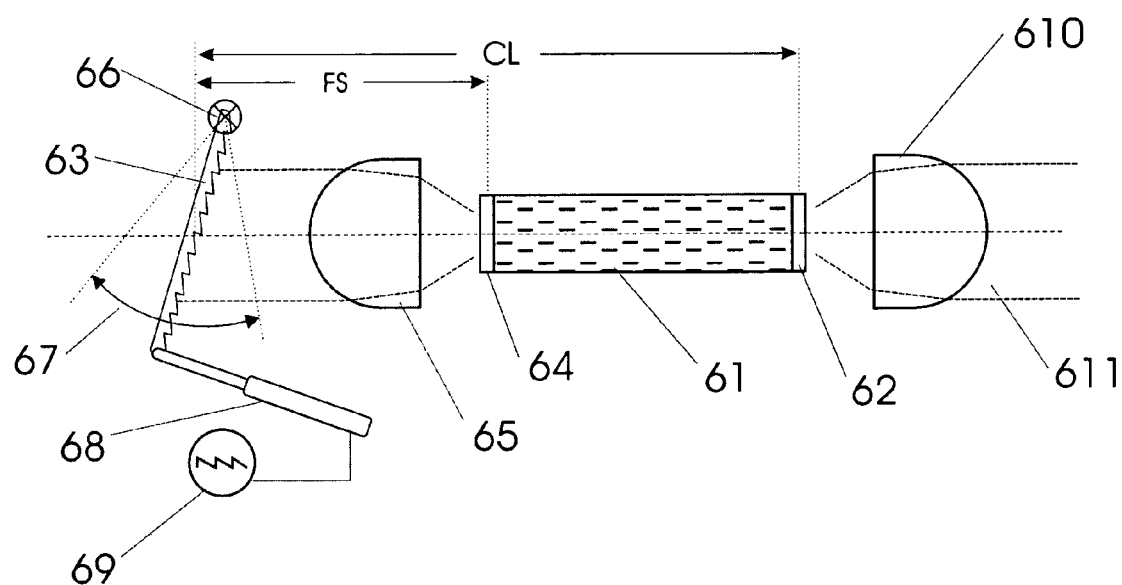
FIG. 6 illustrates in cross section a dynamic wavelength tunable system.

FIG. 6 is a cross section diagram which presents these systems in clear schematic. Quantum well gain medium 61 is joined by thin-film mirror or high reflector element 62 and grating type feedback element 63 to form a cavity; the cavity length being less than about 30 millimeters but preferably about 8-12 millimeters. The cavity includes free space portion FS. An anti-reflection coating 64 deposited on an emission facet of the gain medium and provides good coupling of optical beams both from and to the free space portion of the cavity. Cavity lens 65 is devised and aligned to collimate the beam before falling incident on the grating type dispersion element. The grating may be rotatably mounted on a pivot axis 66 such that rotation about the pivot axis changes the wavelength band which is coupled to the cavity.

A careful observer will also note that rotation on the axis illustrated also simultaneously changes the cavity length CL. In some versions, it is desirable to arrange special pivot axes which permit wavelength tuning while at the same time preserve cavity length. The precise location of all possible axes is not meant to be included in the figure.

The grating can be moved over a range of angles 67 to implicitly give the device a tuning range in agreement with the design of the gain bandwidth. An electromechanical actuator 68 may be connected to the dynamic feedback element. Micro-electromechanical actuators may be configured from piezoelectric crystals, micro stepper motors, linear motors, voice coils, micro-electromechanical systems MEMS, or similar transducers. An electronic drive signal 69 can then be applied to dynamically select the system wavelength and effect scanning functions. Laser output is received by output coupler lens 610 and converted from a highly divergent beam into a highly collimated output beam 611 having a beam waist of a few millimeters up to about 8.

In accordance with the description presented, one will now appreciate these embodiments are defined and distinguished as:

Lasers comprising a gain medium and optical resonator cavity where the gain medium is a quantum well stack semiconductor structure and the cavity is defined as two mirrors separated by about 30 millimeters and includes a free space portion.

These laser systems may also be characterized as having a collimated output beam with a 4-10 millimeter beam waist—$1/e^2$ intensity points. In a special arrangement, a cavity is arranged to lase solely in longitudinal modes—as transverse modes are quenched by a narrow gain medium stripe—stripes about 25 micrometers or slightly less are useful for producing this effect.

Systems where the gain medium includes: planar end facets formed in the natural crystal planes, a waveguide formed about the quantum well stack from optically conductive layers and optically absorbing regrowth material, a current path through the quantum well stack, and a base substrate having a matched crystalline structure with respect to said quantum well stack semiconductor are also included in these embodiments.

Preferred embodiments include lasers having at least one feedback element integrated with the gain medium. Alternative versions, have a feedback element arranged as a high reflector thin film deposited on an end facet of the gain medium. A feedback element may also be a thin film wavelength notch filter deposited on an end facet of the gain medium.

Best versions include a gain medium having an end facet prepared with an anti-reflection coating to facilitate beam coupling to free space.

Preferred embodiments include arrangements where a high reflector is combined with a wavelength select element.

While a grating is preferred in some versions, other dispersion elements might be used to achieve wavelength selection including: acousto-optic light modulator; electro-optic light modulator; a wire grid; a thin-film filter; a prism; a holographic optical element; kinoform; binary optical element; a Fabry-Perot system arranged as a wavelength filter; and a Fresnel surface relief optical element.

A high reflector and wavelength select element is preferably coupled to an end facet of a gain medium by a lens with a numerical aperture greater than about 0.7 and an effective focal length less than about 8 millimeters. Such lenses are near diffraction limited, aspheric plano-convex thick lenses having a working distance less than about 3 millimeters. One particular preferred version is characterized as a thick lens having a center thickness CT=2.08 and the aspheric surface described by the equation:

$$Z = \frac{Y^2}{R(1 + \sqrt{1 - (1+K)Y^2/R^2}\ )} + A_4 Y^4 + A_6 Y^6 + A_8 Y^8$$

where R=2.2015; K=−0.8285; A4=−6.6119; A6=−2.7837; A8=2.6921; and X, Y and Z are spatial axes.

Systems arranged as dynamically tunable include a grating or prism rotatably mounted on a pivot axis coupled to actuator whereby the grating may be rotated in response to application of an electronic drive signal. Preferred actuators are electromechanical transducers from the group: piezoelectric crystals; voice coils; stepper motors; micro electromechanical systems MEMS; and linear motors.

Preferred embodiments include a mounting system of a base element; a lens mount; a feedback element mount arranged about a system axis. The base element is arranged to receive a semiconductor gain medium therein at a receiving seat in a manner where a system axis is coincident with a symmetry axis of the mounted gain medium. The lens mount with a lens therein provides mechanical and mounting support whereby the system axis is coincident with the lens axis. The feedback element mount receives a feedback element provides mechanical and mounting support whereby the system axis intersects an optical surface of the feedback element.

The thermal coefficient of expansion is similar for all the elements of the mounting system to assure even expansion and preserved alignment during temperature changes. This can be accomplished by forming each of the elements from a similar metal. Together, the mounting systems mass can be made as small as a few hundred grams and have no linear dimension greater than about 30 millimeters and occupy a volume of about 30 cubic centimeters. In highest performance versions, a mounting system additionally includes a surface arranged as a thermoelectric cooler interface assuring good thermal coupling between the gain medium seat, lens mount, and feedback element mount.

A diamond submount may be used to better couple the base element to the gain medium in versions having best heat extraction configurations.

A base element has a lapped planar surface which forms a portion of a sliding interface along with the lens plate having a similar flat surface. Lens mounts also have a cylindrical lens holder with lens seat therein, and threaded outer surface.

A mount feedback element is a stationary portion and a movable portion, the movable portion is rotatably mounted about a pivot axis coupled with the stationary portion.

Best versions are lasers with a mounting system also including an output coupler lens mount. Such output coupler lens is arranged to collimate output from the lasers so presented.

The examples above are directed to specific embodiments which illustrate preferred versions of devices and methods of these embodiments. In the interests of completeness, a more general description of devices and the elements of which they are comprised as well as methods and the steps of which they are comprised is presented herefollowing.

One will now fully appreciate how compact and rugged mid-IR lasers having high intensity output beams are realized. Although the present embodiments have been described in considerable detail with clear and concise language and with reference to certain preferred versions thereof including best modes anticipated by the inventors, other versions are possible. Therefore, the spirit and scope of the invention should not be limited by the description of the preferred versions contained therein, but rather by the claims appended hereto.

What is claimed is:

1. A laser comprising:
    a gain medium; and
    an optical resonator cavity,
    wherein the gain medium comprises a unipolar quantum well stack semiconductor structure, and
    wherein the optical resonator cavity is not more than about 30 millimeters in length and comprises at least two feedback elements arranged to couple a feedback beam to the gain medium, and at least one of said feedback elements is spatially removed from said gain medium.

2. A laser as claimed in claim 1, comprising a collimated output beam having a beam waist defined by $1/e^2$ intensity, wherein the diameter of the waist is no more than about 7 millimeters at an exit aperture.

3. A laser as claimed in claim 1, wherein said output beam comprises substantially only longitudinal modes.

4. A laser as claimed in claim 3, wherein said unipolar quantum well stack semiconductor structure is arranged in a narrow stripe which increases resonator losses for transverse oscillation modes such that losses exceed amplifier gain for transverse modes.

5. A laser as claimed in claim 4, wherein said unipolar quantum well stack semiconductor structure is arranged as a narrow stripe of about less than 25 microns.

6. A laser as claimed in claim 1, said gain medium further comprising:
    two end facets;
    a waveguide system;
    a current path; and
    a base substrate,
    wherein said end facets comprise planar surfaces,
    wherein said waveguide system formed about the quantum well stack semiconductor structure is comprised of optically conductive layers and optically absorbing material,
    wherein said current path a comprises a plurality of electrically conductive elements arranged to form a serial electrical circuit through which electric current can pass, and
    wherein said base substrate is a layer of bulk crystal material having a matched crystalline structure with respect to said quantum well stack semiconductor.

7. A laser as claimed in claim 6, wherein at least one feedback element is integrated with the gain medium.

8. A laser as claimed in claim 7, wherein said feedback element is a high reflector thin film deposited on an end facet of the gain medium.

9. A laser as claimed in claim 8, wherein said feedback element is a high reflector thin film wavelength notch filter deposited on an end facet of the gain medium.

10. A laser as claimed in claim 6, wherein a spatially removed feedback element is a high reflector arranged to return an optical beam in free space back to the gain medium via one of said end facets.

11. A laser as claimed in claim 10, wherein said end facet is prepared with an anti-reflection coating.

12. A laser as claimed in claim 11, wherein said anti-reflection coating is arranged as a bandpass filter.

13. A laser as claimed in claim 10, wherein said high reflector is combined with a wavelength select element, the wavelength select element being arranged to couple light of a particular wavelength band to said gain medium.

14. A laser as claimed in claim 13, said wavelength select element is selected from the group consisting of: acousto-optic light modulator; electro-optic light modulator; a grid; a thin-film filter; a prism; a grating; a holographic optical element; kinoform; binary optical element; a Fabry-Perot system arranged as a wavelength filter; and a Fresnel surface relief optical element.

15. A laser as claimed in claim 13, wherein said combined high reflector and wavelength select element is coupled to an end facet of said gain medium by a lens.

16. A laser as claimed in claim 15, wherein said lens has a numerical aperture greater than about 0.7 and an effective focal length less than about 8 millimeters.

17. A laser as claimed in claim 16, wherein said lens is a plano-convex lens having a planar side coupled to said end facet, and a convex side coupled to said combined high reflector and wavelength select element.

18. A laser as claimed in claim 17, wherein said lens is further characterized as a near diffraction limited, aspheric, thick lens having a working distance less than about 3 millimeters.

19. A laser as claimed in claim 18, wherein said thick lens has a center thickness CT=2.08 and the aspheric surface is described by the equation:

$$Z = \frac{Y^2}{R\left(1 + \sqrt{1 - (1+K)Y^2/R^2}\right)} + A_4 Y^4 + A_6 Y^6 + A_8 Y^8$$

where R=2.2015; K=−0.8285; A4=−6.6119; A6=−2.7837; A8=2.6921; and X, Y and Z are spatial axes.

20. A laser as claimed in claim 16, wherein said combined high reflector and wavelength select element is arranged as a grating.

21. A laser as claimed in claim 16, wherein said combined high reflector and wavelength select element is arranged as a prism.

22. A laser as claimed in claim 13, wherein said wavelength select element is arranged as a two part system, each part spatially removed with respect to the other.

23. A laser as claimed in claim 20, wherein said grating is rotatably mounted on a pivot axis.

24. A laser as claimed in claim 23, further comprising an actuator coupled to said grating such that the grating may be rotated about said pivot axis in response to application of a drive signal.

25. A laser as claimed in claim 21, said prism is rotatably mounted on a pivot axis.

26. A laser as claimed in claim 25, further comprising an actuator coupled to said prism such that it may be rotated about said pivot axis in response to application of a drive signal.

27. A laser as claimed in claim 14, wherein said wavelength select element is dynamic in response to an applied signal.

28. A laser as claimed in claim 24, wherein said actuator is an electromechanical transducer selected from the group consisting of: piezoelectric crystal; voice coil; stepper motor; micro electromechanical system; and linear motor.

29. A laser as claimed in claim 26, wherein said actuator is an electromechanical transducer selected from the group consisting of: piezoelectric crystal; voice coil; stepper motor; and linear motor.

30. A laser as claimed in claim 17, wherein said gain medium, said high reflector, said wavelength select element, and said lens are firmly affixed and held in a positionally relative manner by a mounting system.

31. A laser as claimed in claim 30, wherein said mounting system comprises:
a base element;
a lens mount;
a feedback element mount; and
a system axis,
wherein said base element is arranged to receive a semiconductor gain medium therein at a receiving seat and provide mechanical and mounting support thereto such that a system axis is coincident with a symmetry axis of a seated gain medium,
wherein said lens mount is arranged to receive a lens therein and provide mechanical and mounting support thereto such that the system axis is coincident with a lens axis, and
wherein said feedback element mount is arranged to receive a feedback element and to provide mechanical and mounting support thereto such that the system axis intersects an optical surface of the feedback element.

32. A laser as claimed in claim 31, wherein said mounting system is comprised of a plurality of elements, each of said elements having a similar thermal coefficient of expansion.

33. A laser as claimed in claim 32, wherein said plurality of elements are formed from a similar metal.

34. A laser as claimed in claim 33, wherein said mounting system has a mass of no more than about 200 g.

35. A laser as claimed in claim 33, wherein said mounting system has no linear dimension greater than about 30 millimeters.

36. A laser as claimed in claim 31, wherein said mounting system further comprises a surface arranged as a thermoelectric cooler interface.

37. A laser as claimed in claim 36, wherein said surface is thermally coupled to each of said gain medium seat, said lens mount, and said feedback element mount.

38. A laser as claimed in claim 31, wherein said mounting system further comprises a diamond submount element suitable for receipt at the base element receiving seat, said diamond submount element being thermally coupled to said gain medium.

39. A laser as claimed in claim 31, wherein said base element further comprises a lapped planar surface which forms a first portion of a sliding interface.

40. A laser as claimed in claim 31, wherein said base element further comprises electronic leads coupled to said gain medium.

41. A laser as claimed in claim 31, wherein said lens mount further comprises:
a lens holder; and
a lens plate,
wherein said lens holder is a cylindrical element having a receiving cavity and lens seat therein, and further having a threaded outer surface, and
wherein said lens plate has a complementary threaded hole with a thread axis perpendicular to a lapped planar surface forming a second portion of a sliding interface such that the lens holder may be coupled to the lens plate via said threaded interface to provide a linearly adjustable mechanism along the system axis between the lens holder and lens plate.

42. A laser as claimed in claim 31, said feedback element mount further comprising:
a stationary portion; and
a rotatable portion,
wherein said rotatable portion is arranged to receive a feedback element therein at a seat, the rotatable portion being rotatably mounted about a pivot axis provided by the stationary portion.

43. A laser as claimed in claim 31, wherein said mounting system further comprises a lens mount comprising:
- a lens holder; and
- a lens plate,
- wherein said lens holder is a cylindrical element having a receiving cavity and lens and seat therein, and further having a threaded outer surface, and
- wherein said lens plate has a complementary threaded hole with a thread axis perpendicular to a lapped planar surface forming a second portion of a sliding interface such that the lens holder may be coupled to the lens plate via said threaded interface to provide a linearly adjustable mechanism along the system axis between the lens holder and lens plate.

44. A laser as claimed in claim 15, further comprising an output coupler lens arranged to collimate an output beam from said quantum well gain medium.

45. A laser as claimed in claim 44, said lens having a numerical aperture greater than about 0.7 and effective focal length less than about 4 millimeters.

46. A laser as claimed in claim 45, wherein said lens is a plano-convex aspherical thick lens arranged in an infinite conjugate ratio configuration.

47. A laser as claimed in claim 46, wherein said aspheric surface is defined by the relationship:

$$Z = \frac{Y^2}{R\left(1 + \sqrt{1 - (1+K)Y^2/R^2}\right)} + A_4 Y^4 + A_6 Y^6 + A_8 Y^8$$

where $R=2.2015$; $K=-0.8285$; $A4=-6.6119$; $A6=-2.7837$; $A8=2.6921$; and X, Y and Z are spatial axes.

* * * * *

UNITED STATES PATENT AND TRADEMARK OFFICE
CERTIFICATE OF CORRECTION

PATENT NO. : 7,466,734 B1
APPLICATION NO. : 11/525385
DATED : December 16, 2008
INVENTOR(S) : Timothy Day et al.

It is certified that error appears in the above-identified patent and that said Letters Patent is hereby corrected as shown below:

On the Title Page,
In the Other Publications:

Page 2, Item -56-, line 11, please delete the text "Gaetano Scarmarcio et al., Micro-probe characterization of QCLs"

Page 2, Item -56-, line 12, please delete the text "correlation with optical performance, APL 78, 1177 & APL 78, 2095"

Page 2, Item -56-, line 13, please delete the text "(2001), APL 2002, APL 2004, University of Bari, Bari, Italy."

Page 2, Item -56-, line 14, please delete the text "Corrie David Farmer, "Fab and Eval. of QCL's, Sep. 2000, Faculty"

Page 2, Item -56-, line 15, please delete the text "of Engineering, University of Glasgow, Glasgow, UK."

Page 2, Item -56-, line 16, please delete the text "Tsekoun, A. et al;"Improved performance of QCL's through a scal-"

Page 2, Item -56-, line 17, please delete the text "able, manufacturable epitaxial-side-down mounting process", Feb"

Page 2, Item -56-, line 18, please delete "2006."

UNITED STATES PATENT AND TRADEMARK OFFICE
CERTIFICATE OF CORRECTION

PATENT NO. : 7,466,734 B1
APPLICATION NO. : 11/525385
DATED : December 16, 2008
INVENTOR(S) : Timothy Day et al.

It is certified that error appears in the above-identified patent and that said Letters Patent is hereby corrected as shown below:

On Page 2, Item -56-, line 18, please insert the following other publication:

--Faist, J. "THz and mid-IR Quantum cascade lasers" University of Neuchatel, Neuchatel Switzerland.--

Signed and Sealed this

Thirty-first Day of March, 2009

JOHN DOLL
*Acting Director of the United States Patent and Trademark Office*